US008723050B2

(12) United States Patent
Cheng

(10) Patent No.: US 8,723,050 B2
(45) Date of Patent: May 13, 2014

(54) MULTILAYER PRINTED CIRCUIT BOARD AND METHOD FOR MAKING SAME

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 277 days.

(21) Appl. No.: 13/233,189

(22) Filed: Sep. 15, 2011

(65) Prior Publication Data

US 2012/0160554 A1 Jun. 28, 2012

(30) Foreign Application Priority Data

Dec. 28, 2010 (CN) .......................... 2010 1 0605543

(51) Int. Cl.
*H05K 1/11* (2006.01)
*H05K 1/02* (2006.01)
*H05K 3/10* (2006.01)

(52) U.S. Cl.
USPC ........... 174/262; 174/259; 174/263; 174/264; 174/265; 174/266; 29/846

(58) Field of Classification Search
USPC ..................... 174/259, 260, 262, 264; 29/846
See application file for complete search history.

(56) References Cited

U.S. PATENT DOCUMENTS

| | | | | |
|---|---|---|---|---|
| 3,795,047 A | * | 3/1974 | Abolafia et al. ................. | 29/843 |
| 5,502,889 A | * | 4/1996 | Casson et al. .................... | 29/830 |
| 5,527,998 A | * | 6/1996 | Anderson et al. .............. | 174/255 |
| 5,637,834 A | * | 6/1997 | La Bate et al. ................. | 174/264 |
| 5,719,749 A | * | 2/1998 | Stopperan ....................... | 361/769 |
| 6,159,586 A | * | 12/2000 | Inoue et al. ..................... | 428/209 |
| 7,071,423 B2 | * | 7/2006 | Fuller et al. ..................... | 174/262 |
| 2007/0166559 A1 | * | 7/2007 | Tai et al. ......................... | 428/458 |
| 2009/0065245 A1 | * | 3/2009 | Hsu ................................. | 174/260 |

FOREIGN PATENT DOCUMENTS

| | | |
|---|---|---|
| JP | 2009-289971 A | 12/2009 |
| TW | 200520658 A | 6/2005 |
| TW | 200600562 A | 1/2006 |

* cited by examiner

*Primary Examiner* — Timothy Thompson
*Assistant Examiner* — Sherman Ng
(74) *Attorney, Agent, or Firm* — Novak Druce Connolly Bove + Quigg LLP

(57) ABSTRACT

An exemplary multilayer printed circuit board includes a first circuit substrate, a third circuit substrate, a second circuit substrate between the first and third circuit substrates, a first anisotropically conductive adhesive layer between the first and second circuit substrates, and a second anisotropically conductive adhesive layer between the second and third circuit substrates. The first circuit substrate includes a first conductive terminal and a first through hole. The second circuit substrate includes a second conductive terminal and two through holes (i.e. second and third through holes). The third circuit substrate includes a third conductive terminal and a fourth through hole. The first anisotropically conductive adhesive layer fills the first and third through holes to electrically connect the first and second conductive terminals. The second anisotropically conductive adhesive layer fills the second and fourth through holes to electrically connect the second and third conductive terminals.

15 Claims, 19 Drawing Sheets

US 8,723,050 B2

MULTILAYER PRINTED CIRCUIT BOARD AND METHOD FOR MAKING SAME

BACKGROUND

1. Technical Field

The present disclosure generally relates to printed circuit boards (PCBs), and particularly, relates to a method for making a multilayer printed circuit board, and a multilayer printed circuit board made by the method.

2. Description of Related Art

To accommodate the development of miniaturized electronic products with multiple functions, multilayer printed circuit boards are widely used due to their characteristics such as lightness and high-density inter-connectability.

Multilayer printed circuit boards are manufactured using a typical sheet-by-sheet process. Firstly, a core substrate is provided, and an inner electrically conductive trace is formed on the core substrate. Secondly, an adhesive layer and a first electrically conductive layer such as copper foil are laminated onto the core substrate. Thirdly, an electrically conductive trace is formed in the first electrically conductive layer. Afterwards, another adhesive layer and a second electrically conductive layer are laminated onto the electrically conductive trace of the first electrically conductive layer, and another electrically conductive trace is formed in the second electrically conductive layer, thus a multilayer printed circuit board is obtained. However, only one electrically conductive layer can be laminated together at a time. During the processes of laminating the first and second electrically conductive layers and forming electrically conductive traces, conditions such as environmental factors may vary, so different degrees of shrinkage and expansion among the layers make it difficult to align the layers.

What is needed, therefore, is a method for manufacturing a multilayer printed circuit board and a multilayer printed circuit board to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
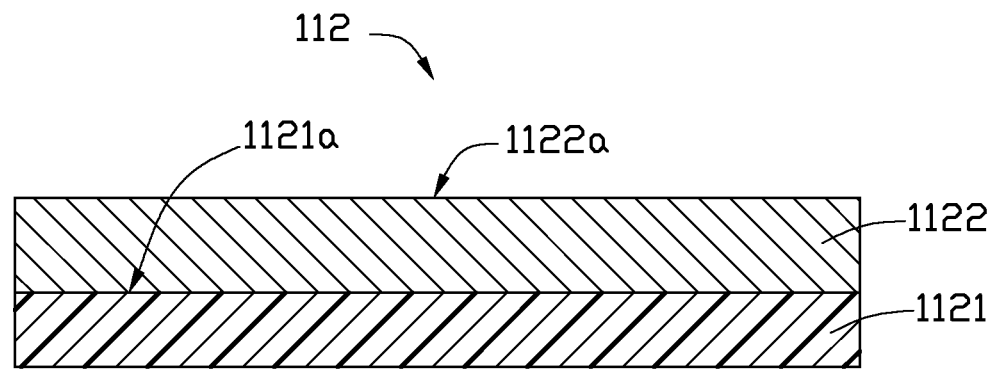
FIGS. 1-11 show successive stages in the making of a multilayer printed circuit board according to a first embodiment.

Embodiments will now be described in detail with reference to the drawings.

Referring to FIGS. 1-11, a method for manufacturing a multilayer PCB according to a first embodiment includes the following steps.

Step 110, referring to FIGS. 1 through 4, a first circuit substrate 11 is provided. The first circuit substrate 11 includes a first electrically conductive trace layer 111, a first dielectric layer 112, and a second dielectric layer 113. The first electrically conductive trace layer 111 is sandwiched between the first dielectric layer 112 and the second dielectric layer 113. The first electrically conductive trace layer 111 includes a first conductive terminal 1111. A first through hole 101 is defined in the second dielectric layer 113 with the first conductive terminal 1111 exposed therethrough.

In detail, the step of providing the first circuit substrate 11 includes the following steps.

Referring to FIG. 1, the first dielectric layer 112 is first provided. The first dielectric layer 112 includes a first protective coating 1121 having a first surface 1121a, and a first adhesive layer 1122 formed on the first surface 1121a of the first protective coating 1121. The first adhesive layer 1122 includes a second surface 1122a away from the first surface 1121a. In the present embodiment, the first protective coating 1121 is a polyimide coating. Generally, the thickness of the first protective coating 1121 is in a range from 12.5 micrometers to 25 micrometers, and the thickness of the first adhesive layer 1122 is in a range from 15 micrometers to 35 micrometers.

Figure 2:
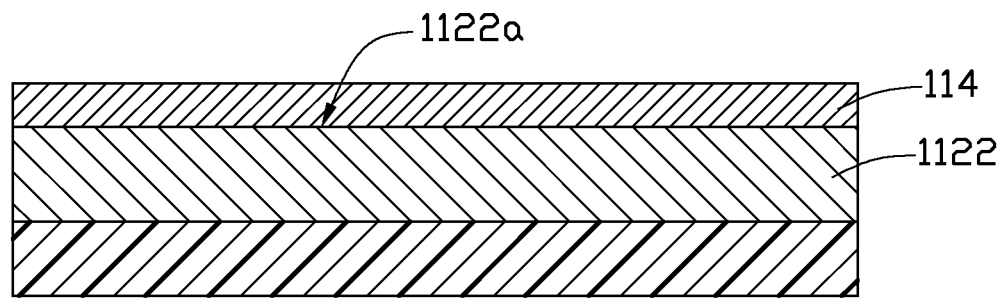

Referring to FIG. 2, a first copper foil layer 114 is provided, and is laminated onto the second surface 1122a of the first adhesive layer 1122. Generally, the thickness of the first copper foil layer 114 is in a range from 18 micrometers to 35 micrometers.

Figure 3:
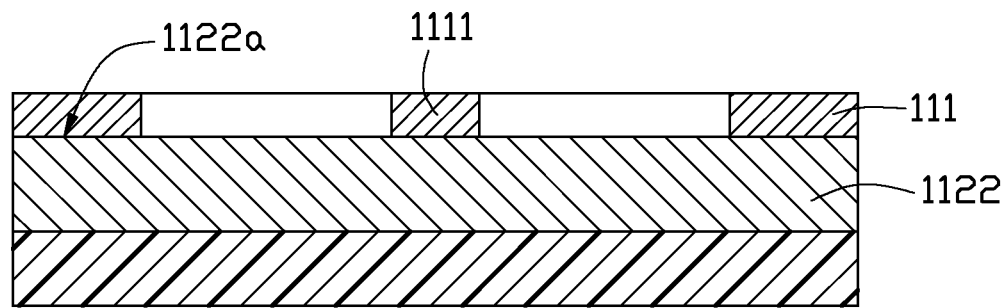

Referring to FIG. 3, the first copper coil layer 114 is patterned thereby obtaining the first electrically conductive trace layer 111. For example, the first copper coil layer 114 may be patterned by removing unwanted copper after applying a temporary mask (e.g. by etching). The first electrically conductive trace layer 111 includes the first conductive terminal 1111.

Figure 4:
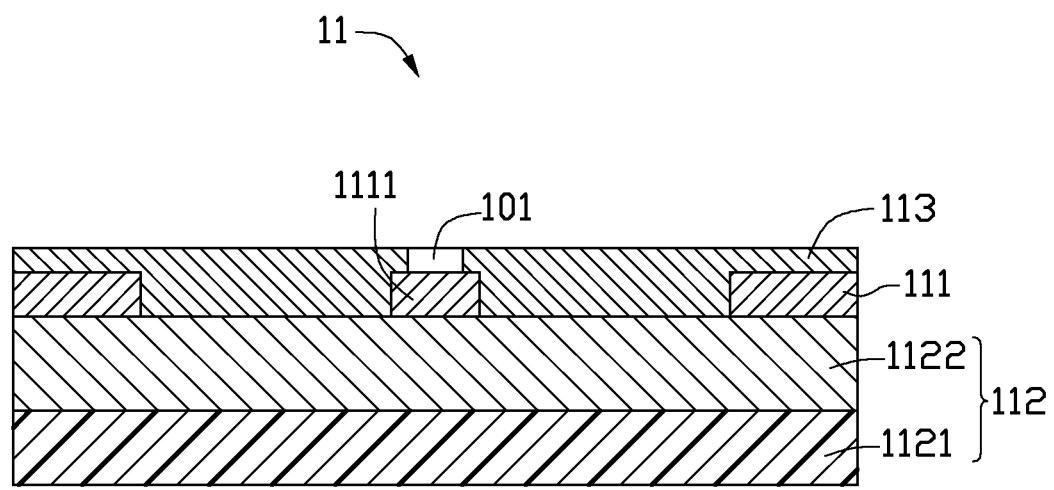

Referring to FIG. 4, the second dielectric layer 113 is formed over the first electrically conductive trace layer 111, and the first through hole 101 is defined in the second dielectric layer 113 with the conductive terminal 1111 exposed therethrough. In the present embodiment, the second dielectric layer 113 is formed over the first electrically conductive trace layer 111 by printing a solder mask on the first electrically conductive trace layer 111. When the solder mask is printed over the first electrically conductive trace layer 111, a position for forming the first through hole 101 is not printed, such that the first through hole 101 can be formed after drying the solder mask. After the above steps, the first circuit substrate 11 is completely formed.

Generally, the thickness of the solder mask is in a range from 15 micrometers to 20 micrometers. In other embodiments, the second dielectric layer 113 may be formed by the adhesion of a protective coating having the first through hole 101 preformed therein. Understandably, the quantity or number, and the position(s) of the first through hole 101 can be determined by the user based on need.

Step 120, referring to FIGS. 5 through 8, a second circuit substrate 12 is provided. The second circuit substrate 12 includes a second electrically conductive trace layer 121, a third dielectric layer 122, and a fourth dielectric layer 123. The second electrically conductive trace layer 121 is sandwiched between the third dielectric layer 122 and the fourth dielectric layer 123. The second electrically conductive trace layer 121 includes a second conductive terminal 1211. A second through hole 102 is defined in the third dielectric layer 122. A third through hole 103 is defined in the fourth dielectric layer 123. The second conductive terminal 1211 is exposed through the second through hole 102 and the third through hole 103.

In detail, the step of providing the second circuit substrate 12 includes the following steps.

Figure 5:
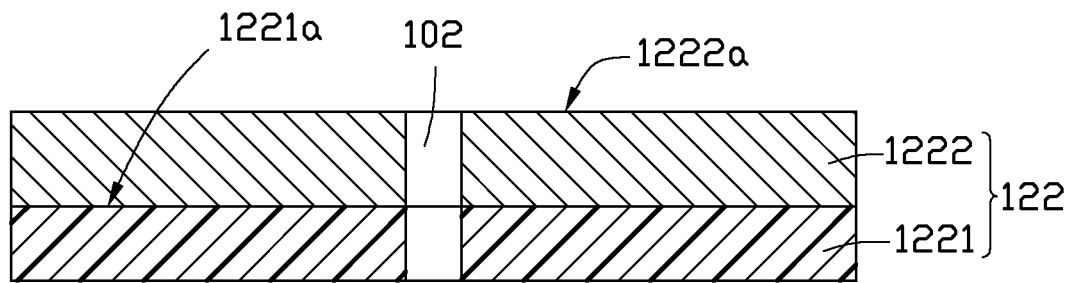

Referring to FIG. 5, the third dielectric layer 122 defining the second through hole 102 is firstly provided. The third dielectric layer 122 includes a second protective coating 1221 having a fourth surface 1221a, and a second adhesive layer 1222 formed on the fourth surface 1221a of the second protective coating 1221. The second through hole 102 passes through the second protective coating 1221 and the second adhesive layer 1222. The second adhesive layer 1222 includes a fifth surface 1222a away from the fourth surface 1221a. In the present embodiment, the second protective coating 1221 is a polyimide coating. Generally, the thickness of the second protective coating 1221 is in a range from 12.5 micrometers to 25 micrometers, and the thickness of the second adhesive layer 1222 is in a range from 15 micrometers to 35 micrometers.

Figure 6:
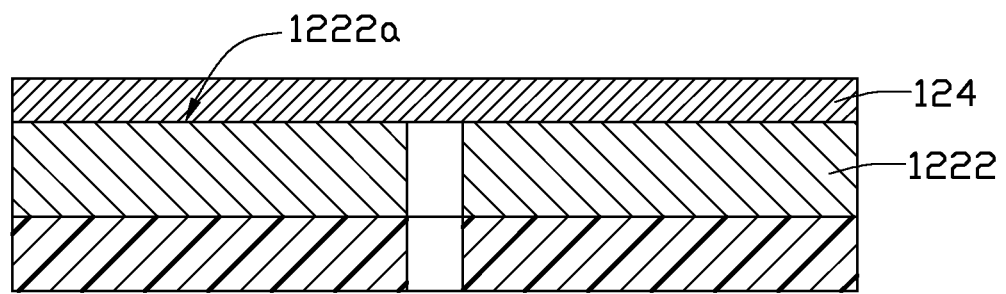

Referring to FIG. 6, a second copper foil layer 124 is provided, and is laminated onto the fifth surface 1222a of the second adhesive layer 1222. Generally, the thickness of the second copper foil layer 124 is in a range from 18 micrometers to 35 micrometers.

Figure 7:
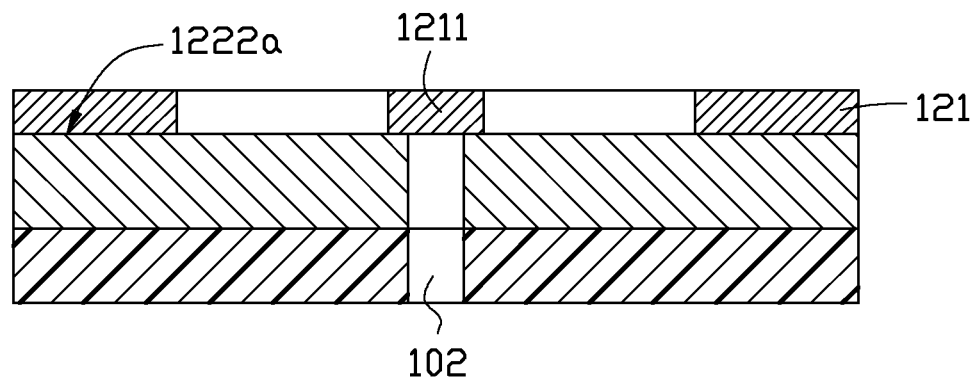

Referring also to FIG. 7, the second copper coil layer 124 is patterned thereby obtaining the second electrically conductive trace layer 121. For example, the second copper coil layer 124 may be patterned by removing unwanted copper after applying a temporary mask (e.g. by etching). The second electrically conductive trace layer 121 includes the second conductive terminal 1211. The second conductive terminal 1211 is exposed through the second through hole 102.

Figure 8:
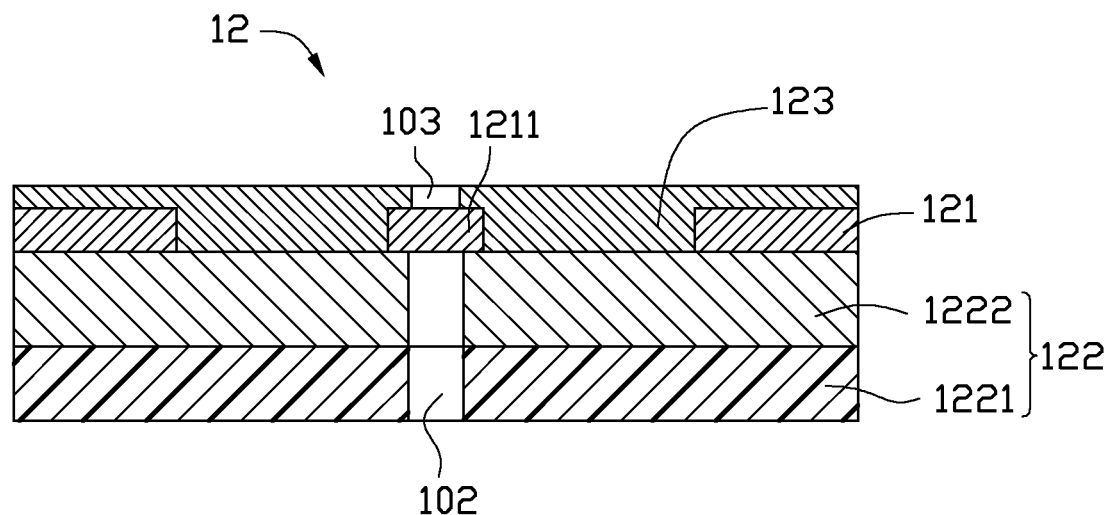

Referring to FIG. 8, the fourth dielectric layer 123 is formed over the second electrically conductive trace layer 121, and the third through hole 103 is defined in the fourth dielectric layer 123 with the second conductive terminal 1211 exposed therethrough. In the present embodiment, the fourth dielectric layer 123 is formed over the second electrically conductive trace layer 121 by printing a solder mask over the second electrically conductive trace layer 121. When the solder mask is printed over the second electrically conductive trace layer 121, a position for forming the third through hole 103 is not printed, such that the third through hole 103 can be formed after drying the solder mask. After the above steps, the second circuit substrate 12 is completely formed. Generally, the thickness of the solder mask is in a range from 15 micrometers to 20 micrometers. In other embodiments, the second dielectric layer 113 may be formed by the adhesion of a protective coating having the first through hole 101 preformed therein. Understandably, the quantities or numbers of the second through hole 102 and the third through hole 103 and their respective positions can be determined by the user based on need.

Figure 9:
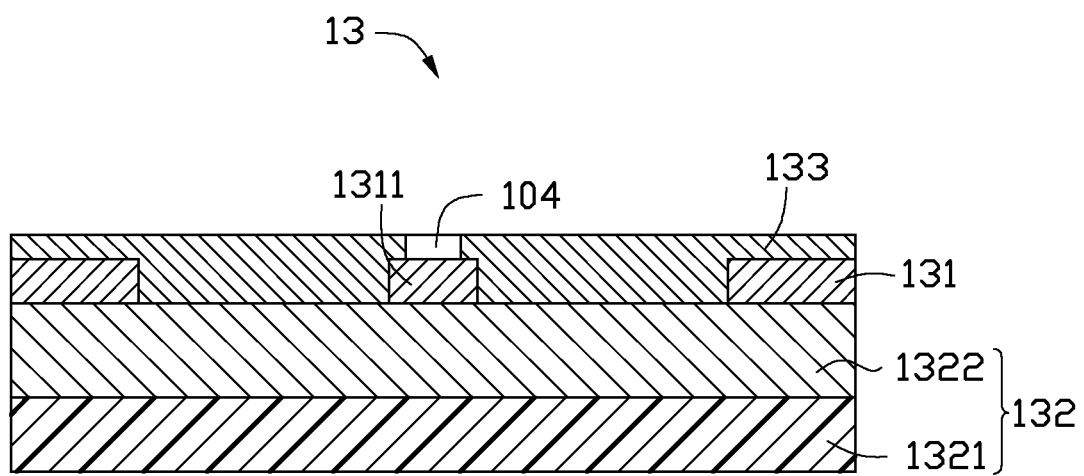

Step 130, referring to FIG. 9, a third circuit substrate 13 is provided. The third circuit substrate 13 includes a third electrically conductive trace layer 131, a fifth dielectric layer 132, and a sixth dielectric layer 133. The third electrically conductive trace layer 131 is sandwiched between the fifth dielectric layer 132 and the sixth dielectric layer 133. The third electrically conductive trace layer 131 includes a third conductive terminal 1311. A fourth through hole 104 is defined in the sixth dielectric layer 133 with the third conductive terminal 1311 exposed therethrough.

The step of providing the third circuit substrate 13 is substantially similar to that of providing the first circuit substrate 11, and includes the following steps.

The fifth dielectric layer 132 is first provided, and includes a third protective coating 1321 and a third adhesive layer 1322 formed on the third protective coating 1321. Then, the third electrically conductive trace layer 131 is formed on the third adhesive layer 1322, and includes the third conductive terminal 133. Finally, the sixth dielectric layer 133 having the fourth through hole 104 is formed over the third electrically conductive trace layer 131, and the fourth through hole 104 is defined in the sixth dielectric layer 133 with the third conductive terminal 1311 exposed therethrough. After the above steps, the third circuit substrate 13 is completely formed.

Figure 10:
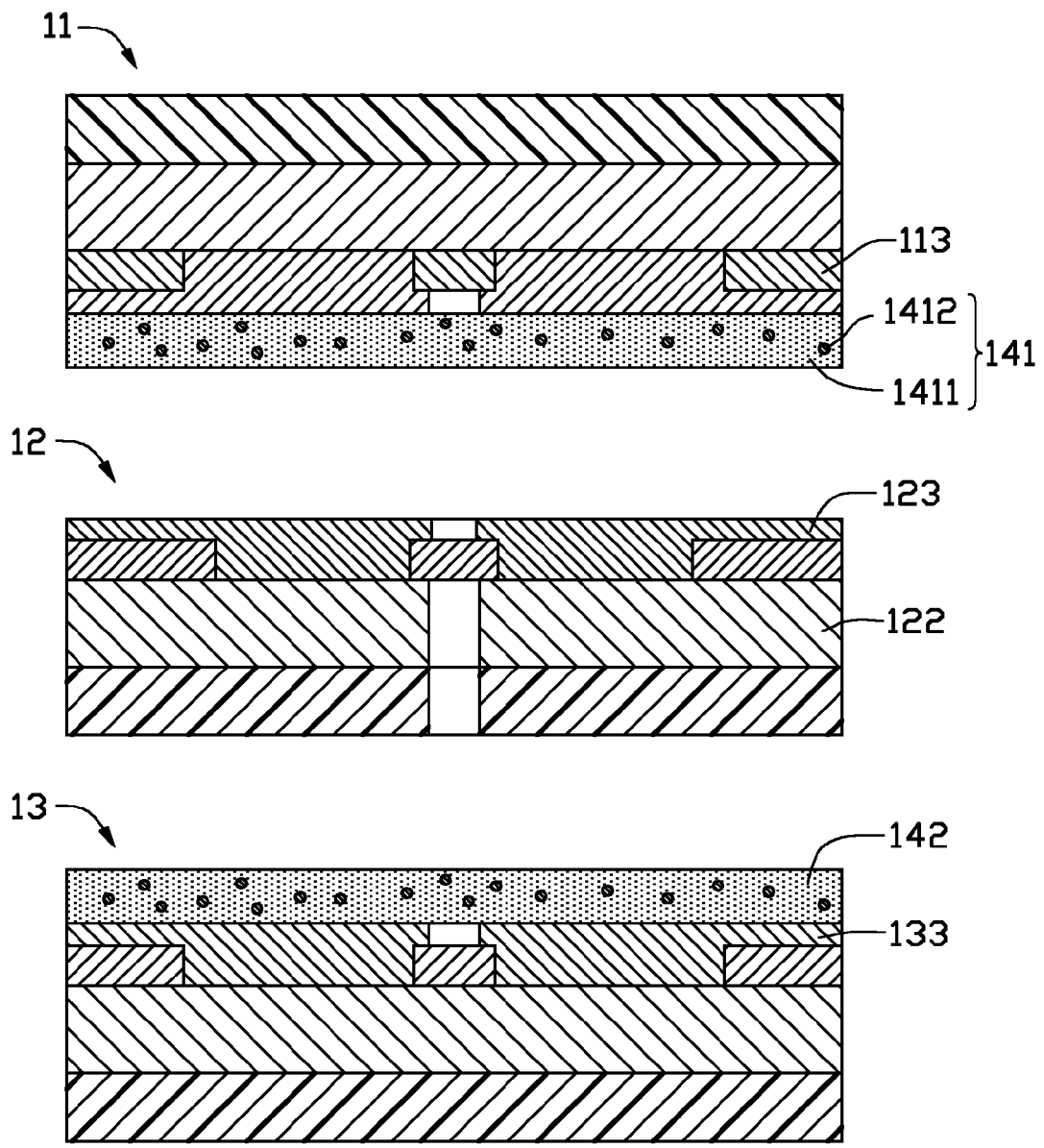

Step 140, referring to FIG. 10, a first anisotropically conductive adhesive layer 141 is formed on one of the second dielectric layer 113 and the fourth dielectric layer 123, and a second anisotropically conductive adhesive 142 is formed on one of the third dielectric layer 122 and the sixth dielectric layer 133. In the present embodiment, the first anisotropically conductive adhesive layer 141 is formed on the second dielectric layer 113 by the printing method, and the second anisotropically conductive adhesive layer 142 is formed on the sixth dielectric layer 133 by the printing method. After printing the first anisotropically conductive adhesive layer 141 and the second anisotropically conductive adhesive layer 142 on the second dielectric layer 113 and the sixth dielectric layer 133 respectively, the first anisotropically conductive adhesive layer 141 and the second anisotropically conductive adhesive layer 142 are solidified by baking or ultraviolet irradiation. The thicknesses of both the first anisotropically conductive adhesive layer 141 and the second anisotropically conductive adhesive layer 142 are in a range from 15 micrometers to 20 micrometers.

Each of the first anisotropically conductive adhesive layer 141 and the second anisotropically conductive adhesive layer 142 includes a dielectric adhesive body 1411 and a plurality of electrically conductive particles 1412 dispersed in the dielectric adhesive body 1411. Each of the electrically conductive particles 1412 is coated by a protective coating (not shown).

In alternative embodiments, the first anisotropically conductive adhesive layer 141 may be formed on the second dielectric layer 113, and the second anisotropically conductive adhesive layer 142 may be formed on the third dielectric layer 122. In further alternative embodiments, the first anisotropically conductive adhesive layer 141 may be formed on the fourth dielectric layer 123, and the second anisotropically conductive adhesive layer 142 may be formed on the third dielectric layer 122. In other alternative embodiments, the first anisotropically conductive adhesive layer 141 may be formed on the fourth dielectric layer 123, and the second anisotropically conductive adhesive layer 142 may be formed on the sixth dielectric layer 133.

Figure 11:
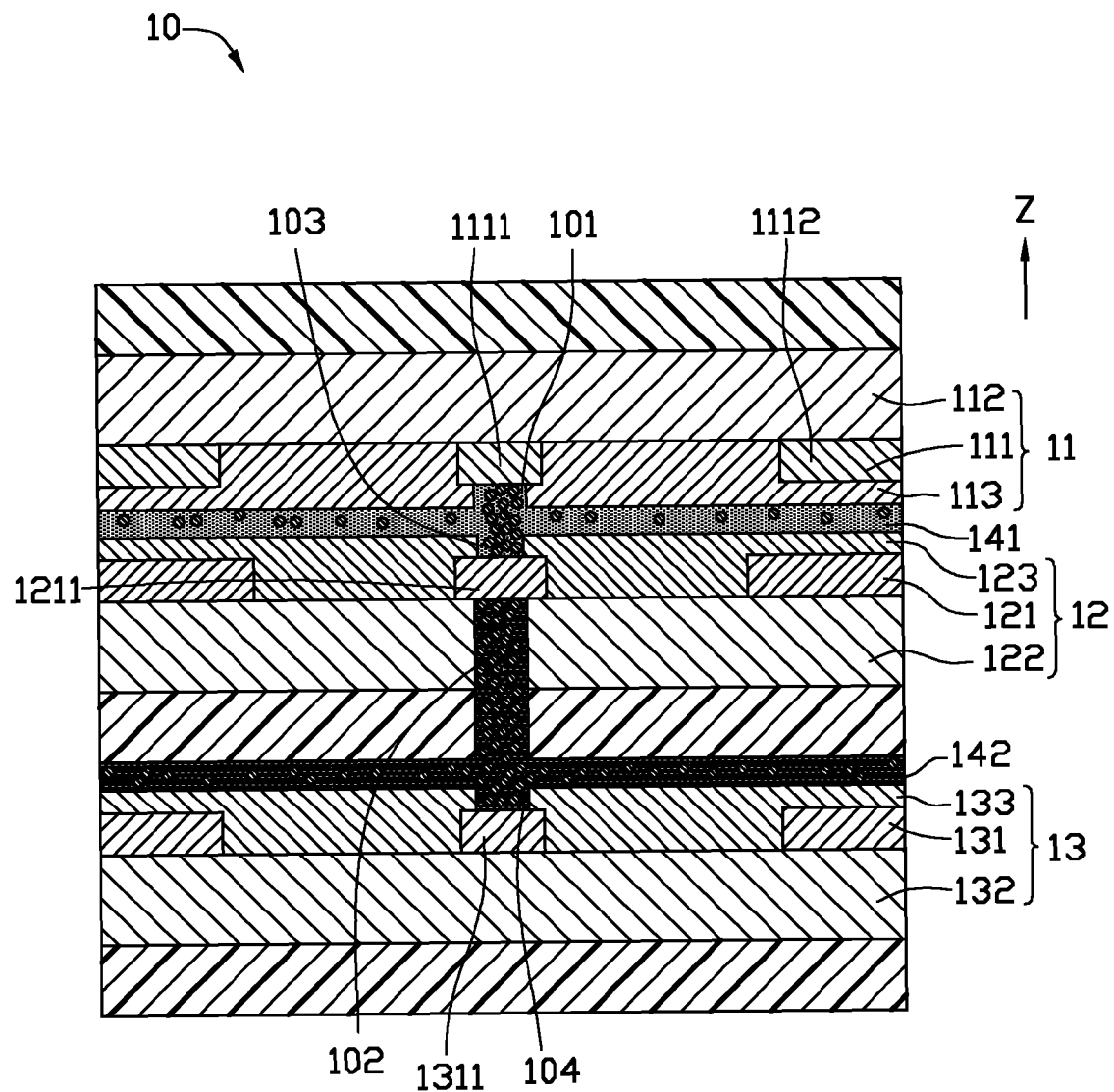

In step 150, referring to FIG. 11, the second circuit substrate 13 is sandwiched between the first circuit substrate 11 and the third circuit substrate 11, and the first, second, and third substrates 11, 12, 13 are laminated together, such that the first anisotropically conductive adhesive layer 141 is adhesively sandwiched between the second dielectric layer 113 and the fourth dielectric layer 123, and extends into the first through hole 101 and the second through hole 102 to electrically connect the first conductive terminal 1111 and the second conductive terminal 1211, and the second anisotropically conductive adhesive layer 142 is adhesively sandwiched between the third dielectric layer 122 and the sixth dielectric layer 133, and extends into the third through hole 103 and the fourth through hole 104 to electrically connect the second conductive terminal 1211 and the third conductive terminal 1311.

In detail, in the process of lamination, the first, second, and third circuit substrates 11, 12, 13 are first pre-laminated. In the present embodiment, the pressure applied in the pre-lamination is in a range from 0.5 megaPascals (0.5 Mpa) to 1.5 Mpa, the temperature of the pre-lamination is in a range from 70 degrees Celsius to 90 degrees Celsius, and the duration of the pre-lamination is in a range from 1 minute to 3 minutes. In the process of pre-lamination, the first anisotropically conductive adhesive layer 141 fills the first through hole 101 and the second through hole 102 under the pressure applied, and makes contact with the first conductive terminal 1111 and the second conductive terminal 1211. The second anisotropically conductive adhesive layer 142 fills the third through hole 103 and the fourth through hole 104 under the pressure applied, and makes contact with the second conductive terminal 1211 and the third conductive terminal 1311.

Next, the first, second, and third circuit substrates 11, 12, 13 are actively laminated. The pressure, temperature, and duration of the active lamination are respectively bigger than that of the pre-lamination. The pre-lamination is followed by the active, or main, lamination. In the present embodiment, the pressure of the main lamination is in a range from 2 Mpa to 4 Mpa, the temperature of the main lamination is in a range from 170 degrees Celsius to 190 degrees Celsius, and the duration of the main lamination is in a range from 12 minutes to 18 minutes.

In the process of the main lamination, the pressure of the main lamination bursts the protective coatings of the electrically conductive particles 1412, and the exposed electrically conductive particles 1412 are then in intimate contact with each other, thereby obtaining a Z-axis unilateral conduction pathway. The Z-axis direction is the direction resulting from the pressure exerted on the first, second, and third circuit substrates 11, 12, 13. The first anisotropically conductive adhesive layer 141 and the second anisotropically conductive adhesive layer 142 makes the first, second, and third circuit substrates 11, 12, 13 adhere to together. After the first anisotropically conductive adhesive layer 141 and the second anisotropically conductive adhesive layer 142 solidify, the multilayer PCB 10 is completed.

The parameters relating to the pressures, the temperatures, and the duration times of the pre-lamination and of the main laminations can be determined by the user based on the material(s) of the first anisotropically conductive adhesive layer 141 and the second anisotropically conductive adhesive layer 142.

The multilayer PCB 10 includes the first circuit substrate 11, the second circuit substrate 12, the third circuit substrate 13, the first anisotropically conductive adhesive layer 141, and the second anisotropically conductive adhesive layer 142.

The first circuit substrate 11 includes the first electrically conductive trace layer 111, the first dielectric layer 112, and the second dielectric layer 113. The first electrically conductive trace layer 111 is sandwiched between the first dielectric layer 112 and the second dielectric layer 113, and includes the first conductive terminal 1111. The first through hole 101 is defined in the second dielectric layer 113 with the first conductive terminal 1111 exposed therethrough.

The second circuit substrate 12 includes the second electrically conductive trace layer 121, the third dielectric layer 122, and the fourth dielectric layer 123. The second electrically conductive trace layer 121 is sandwiched between the third dielectric layer 122 and the fourth dielectric layer 123, and includes the second conductive terminal 1211. The second through hole 102 is defined in the third dielectric layer 122. The third through hole 103 is defined in the fourth dielectric layer 123. The third conductive terminal 1311 is exposed through the second through hole 102 and the third through hole 103.

The third circuit substrate 13 includes the third electrically conductive trace layer 131, the fifth dielectric layer 132, and the sixth dielectric layer 133. The third electrically conductive trace layer 131 is sandwiched between the fifth dielectric layer 132 and the sixth dielectric layer 133, and includes the third conductive terminal 1311. The fourth through hole 104 is defined in the sixth dielectric layer 133 with the third conductive terminal 1311 exposed therethrough.

The first anisotropically conductive adhesive layer 141 is sandwiched between the second dielectric layer 113 and the fourth dielectric layer 123, and fills the first through hole 101 and the second through hole 103 to electrically connect the first conductive terminal 1111 and the second conductive terminal 1211. The second anisotropically conductive adhesive layer 142 is sandwiched between the third dielectric layer 122 and the sixth dielectric layer 133, and fills the third through hole 103 and the fourth through hole 104 to electrically connect the second conductive terminal 1211 and the third conductive terminal 1311.

In other embodiments, there may be two or more second circuit substrates 12 between the first circuit substrate 11 and the third circuit substrate 13.

Referring to FIGS. 12-19, a method for manufacturing a multilayer PCB according to a second embodiment includes the following steps.

Figure 12:
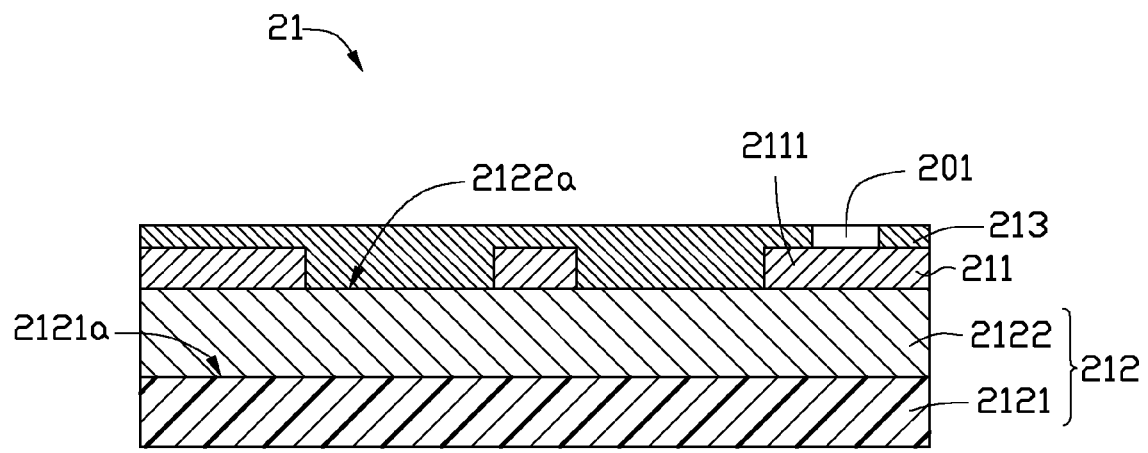
FIGS. 12-19 show successive stages in the making of a multilayer printed circuit board according to a second embodiment.

In step 210, referring to FIG. 12, a first circuit substrate 21 is provided. The first circuit substrate 21 includes a first electrically conductive trace layer 211, a first dielectric layer 212, and a second dielectric layer 213. The first electrically conductive trace layer 211 is sandwiched between the first dielectric layer 212 and the second dielectric layer 213. The first electrically conductive trace layer 211 includes a first conductive terminal 2111. A first through hole 201 is defined in the second dielectric layer 213 with the first conductive terminal 2111 exposed therethrough.

The step of providing the first circuit substrate 21 is similar to that of providing the first circuit substrate 11, and includes the following steps. The first dielectric layer 212 is firstly provided. The first dielectric layer 212 includes a first protective coating 2121 having a first surface 2121a, and a first adhesive layer 2122 formed on the first surface 2121a of the first protective coating 2121. Then, the first electrically conductive trace layer 211 is formed on the second surface 2122a of the first adhesive layer 2122. The first electrically conductive trace layer 211 includes the first conductive terminal 2111. Finally, the second dielectric layer 213 is formed over the first electrically conductive trace layer 111, and the first through hole 201 is defined in the second dielectric layer 213. After the above steps, the first circuit substrate 21 is completely formed.

Step 220, referring to FIGS. 13 through 16, a second circuit substrate 22 is provided.

The second circuit substrate 22 (see FIG. 16) includes a second electrically conductive trace layer 221, a third dielectric layer 222, and a fourth dielectric layer 223. The second electrically conductive trace layer 221 is sandwiched between the third dielectric layer 222 and the fourth dielectric layer 223. The second electrically conductive trace layer 221 includes a second conductive terminal 2211. A second through hole 202 is defined in the third dielectric layer 222. A third through hole 203 is defined in the fourth dielectric layer 223. The second conductive terminal 2211 is exposed through the second through hole 202 and the third through hole 203.

In detail, the step of providing the second circuit substrate 22 includes the following steps.

Figure 13:
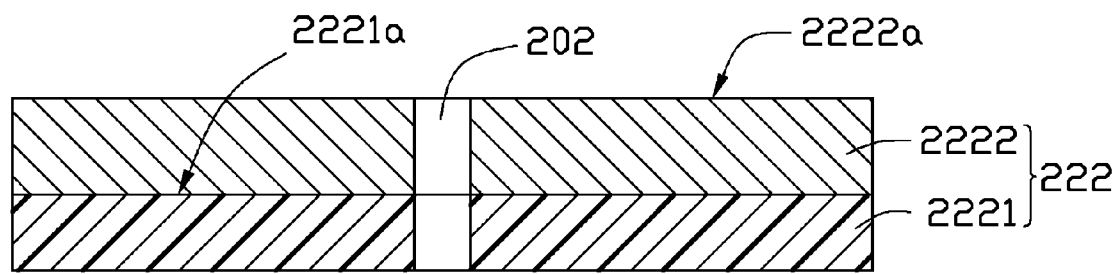

Referring to FIG. 13, the third dielectric layer 222 defining the second through hole 202 is firstly provided. The third dielectric layer 222 includes a second protective coating 221 having a fourth surface 2221a, and a second adhesive layer 2222 formed on the fourth surface 2221a of the second protective coating 2221. The second through hole 202 passes through the second protective coating 2221 and the second adhesive layer 2222. The second adhesive layer 2222 includes a fifth surface 2222a away from the fourth surface 2221a. In the present embodiment, the second protective coating 2221 is a polyimide coating. Generally, the thickness of the second protective coating 2221 is in a range from 12.5 micrometers to 25 micrometers, and the thickness of the second adhesive layer 2222 is in a range from 15 micrometers to 35 micrometers.

Figure 14:
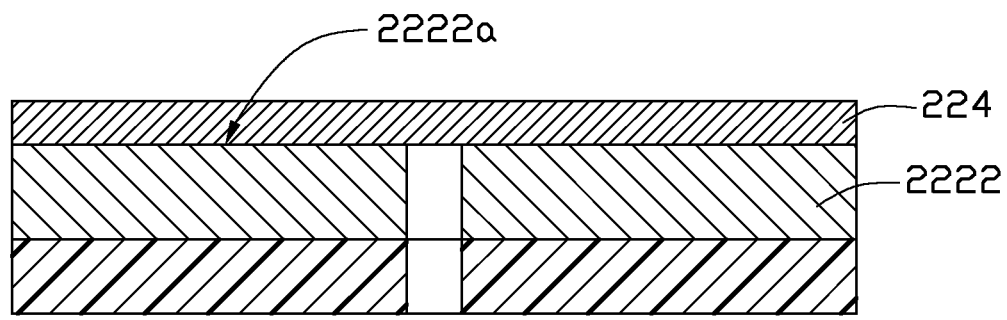

Referring to FIG. 14, a second copper foil layer 224 is provided, and is laminated onto the fifth surface 2222a of the second adhesive layer 2222. Generally, the thickness of the second copper foil layer 224 is in a range from 18 micrometers to 35 micrometers.

Figure 15:
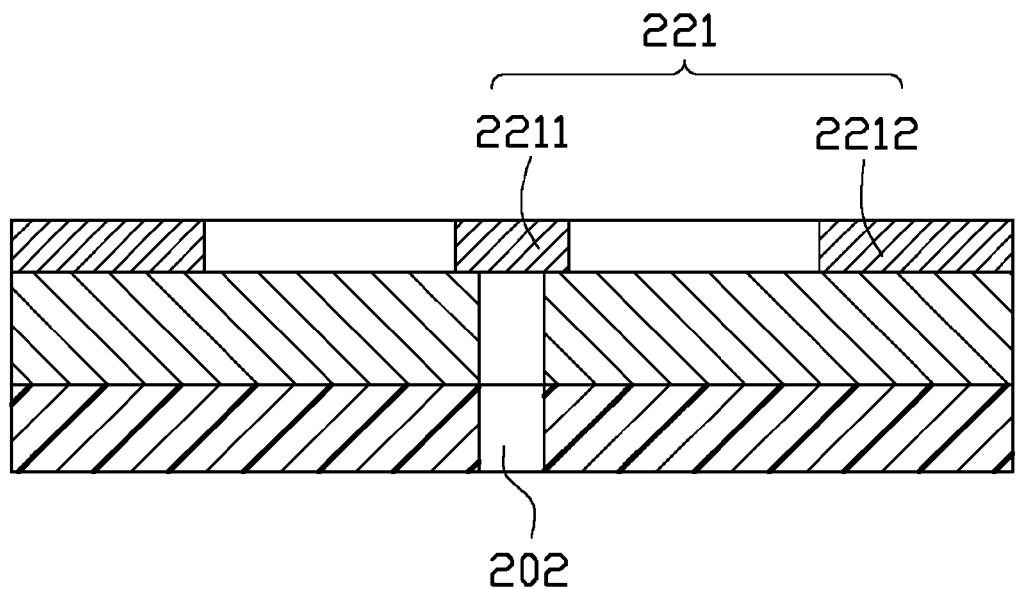

Referring to FIG. 15, the second copper coil layer 224 is patterned thereby obtaining the second electrically conductive trace layer 221. For example, the second copper coil layer 224 may be patterned by removing unwanted copper after applying a temporary mask (e.g. by etching). The second electrically conductive trace layer 221 includes the second conductive terminal 2211 and the third conductive terminal 2212. The second conductive terminal 2211 is exposed through the second conductive terminal 2211.

Figure 16:
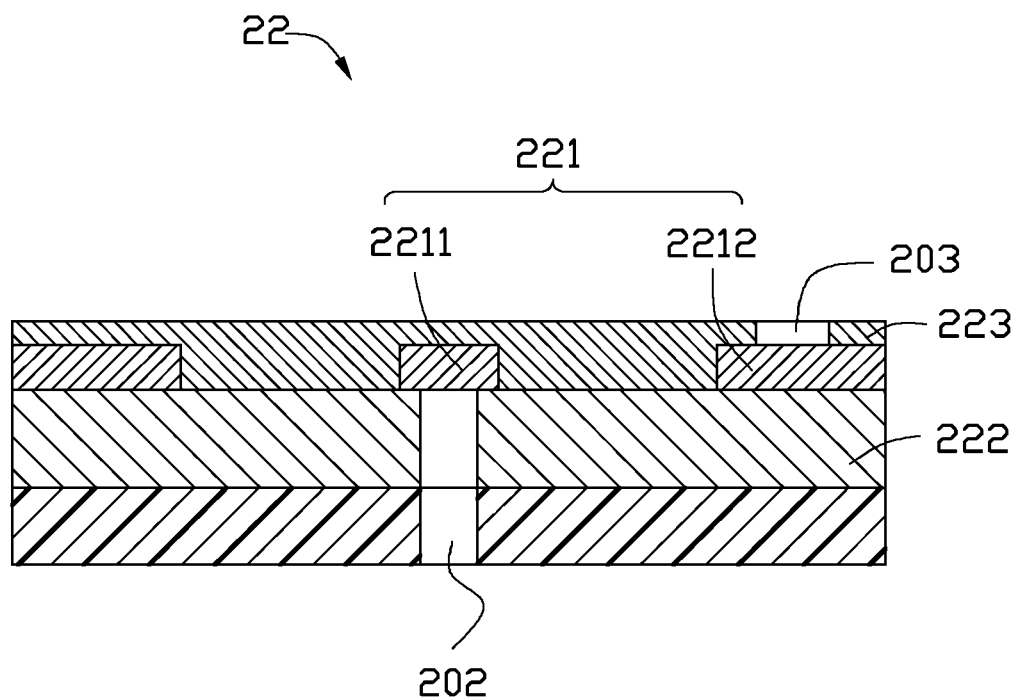

Referring to FIG. 16, the fourth dielectric layer 223 is formed on the second electrically conductive trace layer 221, and the third through hole 403 is defined in the fourth dielectric layer 223 with the third conductive terminal 2212 exposed therethrough. In the present embodiment, the fourth dielectric layer 223 is formed on the second electrically conductive trace layer 221 by printing a solder mask on the second electrically conductive trace layer 221. When the solder mask is printed on the second electrically conductive trace layer 221, a position for forming the third through hole 203 is not printed, such that the third through hole 203 can be formed after drying the solder mask. After the above steps, the second circuit substrate 22 is completely formed. In other embodiments, the second dielectric layer 113 may be formed by the adhesion of a protective coating having the first through hole 201 preformed therein. Understandably, the number(s) or quantity(ies) of the second through hole 202 and the third through hole 203 and their respective positions can be determined by the user based on need.

Figure 17:
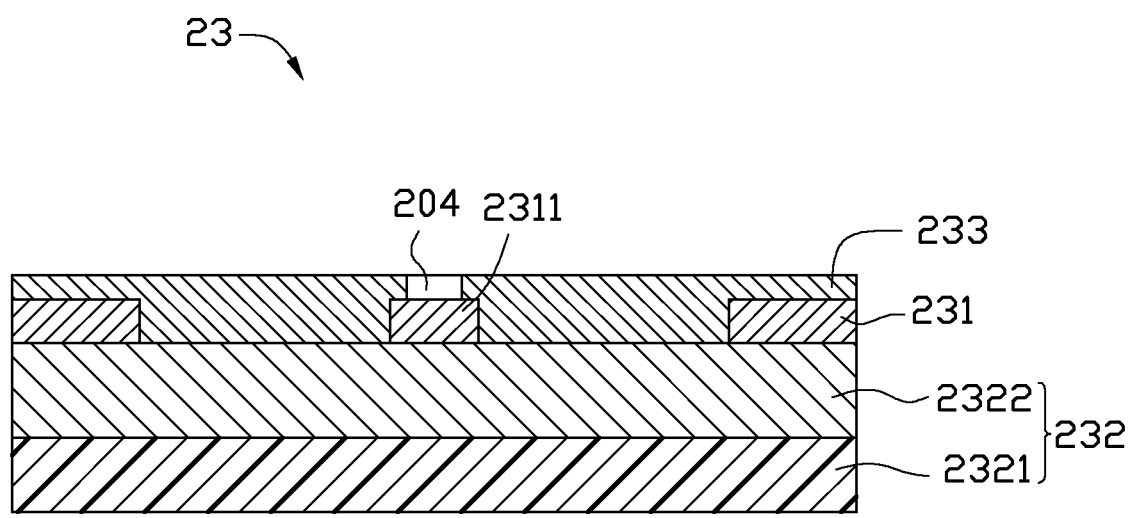

In step 230, referring to FIG. 17, a third circuit substrate 23 is provided. The third circuit substrate 23 includes a third electrically conductive trace layer 231, a fifth dielectric layer 232, and a sixth dielectric layer 233. The third electrically conductive trace layer 231 is sandwiched between the fifth dielectric layer 232 and the sixth dielectric layer 233. The third electrically conductive trace layer 231 includes a third conductive terminal 2311. A fourth through hole 204 is defined in the sixth dielectric layer 233 with the third conductive terminal 2311 exposed therethrough.

The step of providing the third circuit substrate 23 is substantially similar to that of providing the third circuit substrate 13, and includes the following steps.

The fifth dielectric layer 232 is first provided, and includes a third protective coating 2321 and a third adhesive layer 2322 formed on the third protective coating 2321. Then, the third electrically conductive trace layer 231 is formed on the third adhesive layer 2322, and the third electrically conductive trace layer 231 includes a fourth conductive terminal 2331. Finally, the sixth dielectric layer 233 is formed over the third electrically conductive trace layer 231, and the fourth through hole 204 is defined in the sixth dielectric layer 233. After the above steps, the third circuit substrate 23 is completely formed.

Figure 18:
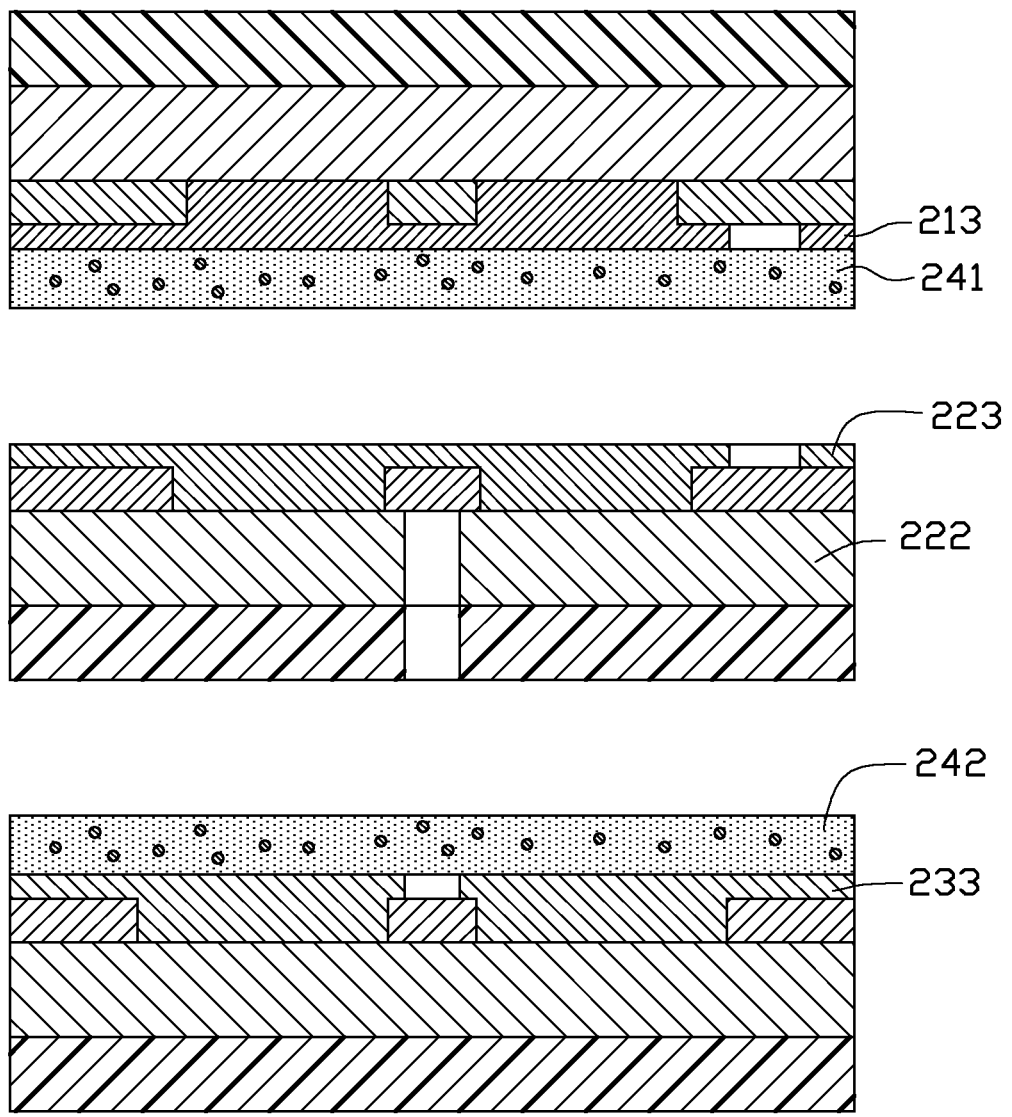

In step 240, referring to FIG. 18, a first anisotropically conductive adhesive layer 241 is formed on one of the second dielectric layer 213 and the fourth dielectric layer 223, and a second anisotropically conductive adhesive 242 is formed on one of the third dielectric layer 222 and the sixth dielectric layer 233.

In the present embodiment, the process of forming a first anisotropically conductive adhesive layer 241 and a second anisotropically conductive adhesive 242 is similar to that of the first anisotropically conductive adhesive layer 141 and the second anisotropically conductive adhesive 142, and the description need not be repeated.

Figure 19:
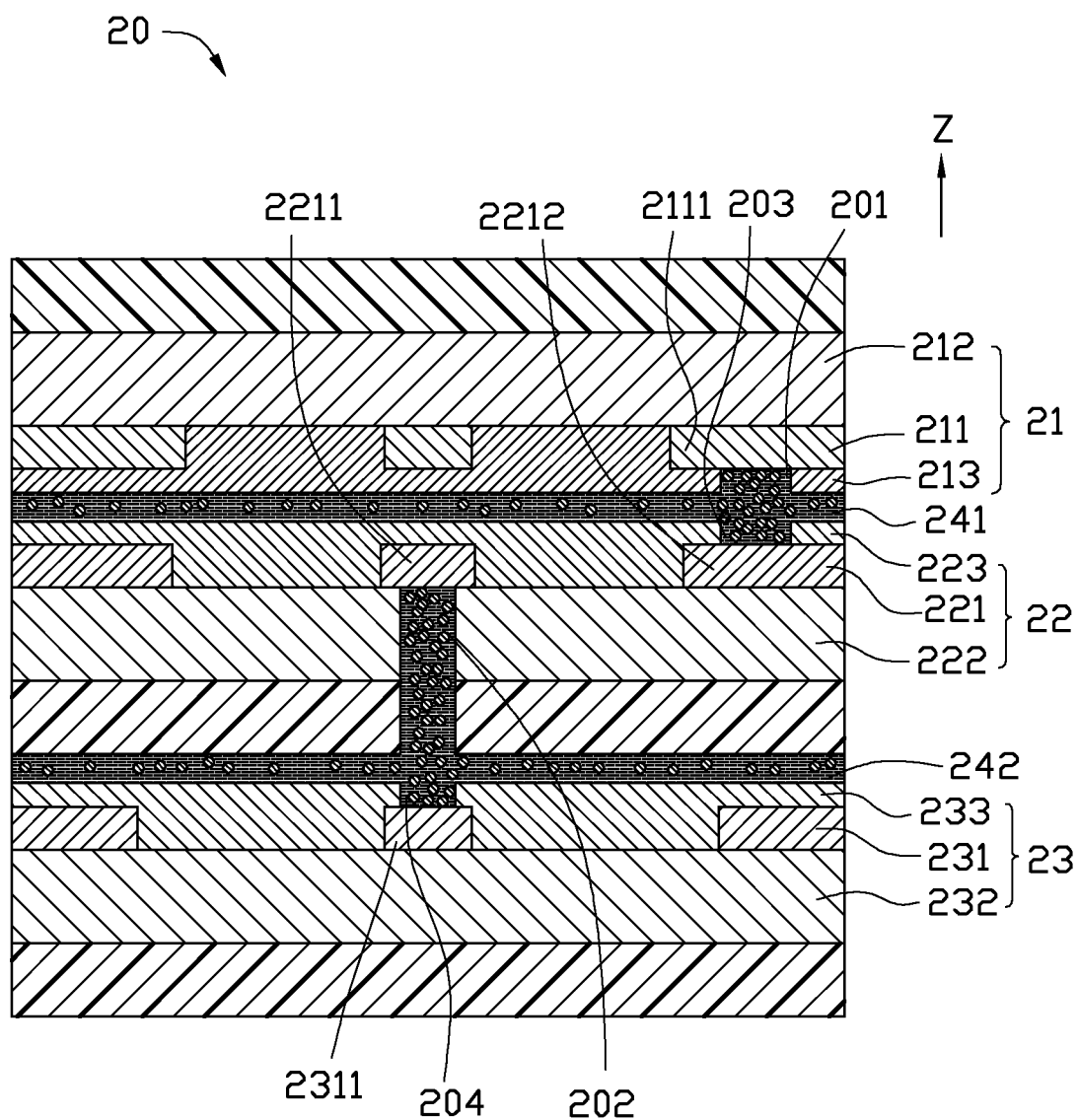

In step 250, referring to FIG. 19, the second circuit substrate 23 is sandwiched between the first circuit substrate 21 and the third circuit substrate 21, and the first, second, and third substrate 21, 22, 23 are laminated together, such that the first anisotropically conductive adhesive layer 241 is adhesively sandwiched between the second dielectric layer 213 and the fourth dielectric layer 223, and fills the first through hole 201 and the third through hole 203 to electrically connect the first conductive terminal 2111 and the third conductive terminal 2212. The second anisotropically conductive adhesive layer 242 is adhesively sandwiched between the third dielectric layer 222 and the sixth dielectric layer 233, and fills the second through hole 202 and the fourth through hole 204 to electrically connect the second conductive terminal 2211 and the fourth conductive terminal 2311.

In detail, in the process of lamination, the first, second, and third circuit substrates 21, 22, 23 are first pre-laminated. In the present embodiment, the pressure applied in the pre-lamination process is in a range from 0.5 Mpa to 1.5 Mpa, the temperature of the pre-lamination is in a range from 70 degrees Celsius to 90 degrees Celsius, and the duration of the pre-lamination is in a range from 1 minute to 3 minutes. In the process of the pre-lamination, the first anisotropically conductive adhesive layer 241 fills the first through hole 201 and the third through hole 203 under the pressure applied, and makes contact with the first conductive terminal 2111 and the third conductive terminal 2212. The second anisotropically conductive adhesive layer 242 fills the second through hole 202 and the fourth through hole 204 under the pressure applied, and makes contact with the second conductive terminal 2211 and the fourth conductive terminal 2311.

Next, the first, second, and third circuit substrates 21, 22, 23 are laminated as a substantive operation (the main lamination). The pressures, temperatures, and durations of the main lamination are respectively bigger than that of the pre-lamination. The pre-lamination is followed by the main lamination. In the present embodiment, the pressure applied in the main lamination is in a range from 2 Mpa to 4 Mpa, the main lamination is carried out at a temperature in a range from 170 degrees Celsius to 190 degrees Celsius, and the duration time of the main lamination is in a range from 12 minutes to 18 minutes. In the process of the main lamination, the pressure applied in the main lamination makes the protective coatings of the electrically conductive particles 2412 burst, and the exposed electrically conductive particles 2412 then make intimate contact with each other thereby obtaining a Z-axis unilateral pathway. The Z-axis direction is the direction resulting from the way in which the pressure is applied to the first, second, and third circuit substrates 21, 22, 23. The first anisotropically conductive adhesive layer 241 and the second anisotropically conductive adhesive layer 242 create adhesion between the first, second, and third circuit substrates 21, 22, 23. After the first anisotropically conductive adhesive layer 241 and the second anisotropically conductive adhesive layer 242 solidify, the multilayer PCB 20 is completed.

The multilayer PCB 20 includes the first circuit substrate 21, the second circuit substrate 22, the third circuit substrate 23, the first anisotropically conductive adhesive layer 241, and the second anisotropically conductive adhesive layer 242.

The first circuit substrate 21 includes the first electrically conductive trace layer 211, the first dielectric layer 212, and the second dielectric layer 213. The first electrically conductive trace layer 211 is sandwiched between the first dielectric layer 212 and the second dielectric layer 213, and includes the first conductive terminal 2111. The first through hole 201 is defined in the second dielectric layer 213 with the first conductive terminal 2111 exposed therethrough.

The second circuit substrate 22 includes the second electrically conductive trace layer 221, the third dielectric layer 222, and the fourth dielectric layer 223. The second electrically conductive trace layer 221 is sandwiched between the third dielectric layer 222 and the fourth dielectric layer 223, and includes the second conductive terminal 2211 and the third conductive terminal 2212. The second through hole 102 is defined in the third dielectric layer 122 with the second conductive terminal 2211 exposed therethrough. The third through hole 103 is defined in the fourth dielectric layer 123 with the third conductive terminal 2212 exposed therethrough.

The third circuit substrate 23 includes the third electrically conductive trace layer 231, the fifth dielectric layer 232, and the sixth dielectric layer 233. The third electrically conductive trace layer 231 is sandwiched between the fifth dielectric layer 232 and the sixth dielectric layer 233, and includes the fourth conductive terminal 2311. The fourth through hole 204 is defined in the sixth dielectric layer 233 with the fourth conductive terminal 2311 exposed therethrough.

The first anisotropically conductive adhesive layer 241 is sandwiched between the second dielectric layer 213 and the fourth dielectric layer 223, and fills the first through hole 201 and the third through hole 203 to electrically connect the first conductive terminal 2111 and the third conductive terminal 2212. The second anisotropically conductive adhesive layer 242 is sandwiched between the third dielectric layer 222 and the sixth dielectric layer 233, and fills the second through hole 203 and the fourth through hole 204 to electrically connect the second conductive terminal 2211 and the fourth conductive terminal 2311.

In other embodiments, there may be two or more second circuit substrates 22 between the first circuit substrate 21 and the third circuit substrate 23.

The first circuit substrate, the second circuit substrate, and the third circuit substrate of the multilayer PCB can be laminated together in one operation because of the first anisotropically conductive adhesive layer and the second anisotropically conductive adhesive layer. Accordingly, any misalignments of the first circuit substrate, the second circuit substrate, and the third circuit substrate, which can occur in multi-step lamination process, is avoided. In addition, because the first circuit substrate, the second circuit substrate, and the third circuit substrate define through holes for electrical conduction, the first anisotropically conductive adhesive layer and the second anisotropically conductive adhesive layer can fill the through holes to create electrical conductivity between the second circuit substrate, and the third circuit substrate. Accordingly, the haphazard conductivity between the first circuit substrate, the second circuit substrate, and the third circuit substrate, which can occur in electroplating, is avoided.

Because there is no selective electroplating in the process of making the multilayer PCB of the present disclosure, the making process(es) of the multilayer PCB of the present disclosure is very simple. Additionally, there is no immersion in electroplating liquid of the circuit substrate in the making process of the multilayer PCB of the present disclosure, therefore the extent of any non-linear deformation of the circuit substrate by expansion or contraction is reduced. Accordingly, the precision of the alignment(s) in this process is improved.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing multilayer printed circuit board, comprising:

providing a first circuit substrate, the first circuit substrate comprising a first electrically conductive trace layer, a first dielectric layer, and a second dielectric layer, the first electrically conductive trace layer being sandwiched between the first dielectric layer and the second dielectric layer, the first electrically conductive trace layer comprising a first conductive terminal, the second dielectric layer being a solder mask and filling gaps defined between the first electrically conductive trace layer, a first through hole defined in the second dielectric layer with the first conductive terminal exposed therethrough;

providing a second circuit substrate, the second circuit substrate comprising a second electrically conductive trace layer, a third dielectric layer, and a fourth dielectric layer, the second electrically conductive trace layer being sandwiched between the third dielectric layer and the fourth dielectric layer, the second electrically conductive trace layer comprising a second conductive terminal, a second through hole defined in the third dielectric layer, a third through hole defined in the fourth dielectric layer, the second conductive terminal being exposed through the second through hole and the third through hole;

providing a third circuit substrate, the third circuit substrate comprising a third electrically conductive trace layer, a fifth dielectric layer, and a sixth dielectric layer, the third electrically conductive trace layer being sandwiched between the fifth dielectric layer and the sixth dielectric layer, the third electrically conductive trace layer comprising a third conductive terminal, a fourth through hole defined in the sixth dielectric layer with the third conductive terminal exposed therethrough;

forming a first anisotropically conductive adhesive layer on one of the second dielectric layer and the fourth dielectric layer;

forming a second anisotropically conductive adhesive layer on one of the third dielectric layer and the sixth dielectric layer, and positioning the second circuit substrate between the first circuit substrate and the third circuit substrate; and laminating the first circuit substrate, the second circuit substrate, and the third circuit substrate together, such that the first anisotropically conductive adhesive layer is adhesively sandwiched between the second dielectric layer and the fourth dielectric layer, and extends into the first through hole and the third through hole to electrically connect the first conductive terminal to the second conductive terminal, the second anisotropically conductive adhesive layer is adhesively sandwiched between the third dielectric layer and the sixth dielectric layer, and extends into the second through hole and the fourth through hole to electrically connect the second conductive terminal to the third conductive terminal.

2. The method of claim 1, wherein the step of providing the first circuit substrate comprises:
   providing the first dielectric layer, the first dielectric layer comprising a first protective coating and a first adhesive layer formed on the first protective coating, and the first protective coating being a polyimide coating and contacting a portion of the second dielectric layer filling the gaps defined between the first electrically conductive trace layer;
   providing a first copper foil layer and laminating the first copper foil layer onto the first adhesive layer;
   patterning the first copper foil layer thereby obtaining the first electrically conductive trace layer;
   forming the second dielectric layer over the first electrically conductive trace layer; and
   defining the first through hole in the second dielectric layer.

3. The method of claim 2, wherein the second dielectric layer is formed over the first electrically conductive trace layer by printing a solder mask on the first electrically conductive trace layer, and the solder mask is not printed on a portion of the first electrically conductive trace layer for forming the first through hole when the second dielectric layer is printed over the first electrically conductive trace layer, and the first through hole is formed after drying the solder mask.

4. The method of claim 3, wherein the step of providing the second circuit substrate comprises:
   providing the third dielectric layer and defining the second through hole in the third dielectric layer, the third dielectric layer comprising a second protective coating and a second adhesive layer formed on the second protective coating, the second through hole passing through the second protective coating and the second adhesive layer;
   providing a second copper foil layer and laminating the second copper foil layer onto the second adhesive layer;
   patterning the second copper foil layer thereby obtaining the second electrically conductive trace layer, and
   forming the fourth dielectric layer over the third electrically conductive trace layer, the fourth dielectric layer being a solder mask and filling gaps defined between the third electrically conductive trace layer, and defining the third through hole in the fourth dielectric layer.

5. The method of claim 4, wherein the step of providing the third circuit substrate comprises:
   providing the fifth dielectric layer, the fifth dielectric layer comprising a third protective coating and a third adhesive layer formed on the third protective coating;
   providing a third copper foil layer and laminating the third copper foil layer onto the third adhesive layer;
   patterning the third copper foil layer thereby obtaining the third electrically conductive trace layer, and
   forming the sixth dielectric layer over the third electrically conductive trace layer, the sixth dielectric layer being a solder mask, and defining the fourth through hole in the sixth dielectric layer.

6. The method of claim 4, wherein after the first anisotropically conductive adhesive layer is formed on one of the second dielectric layer and the fourth dielectric layer, the thickness of the first anisotropically conductive adhesive layer is in a range from 15 micrometers to 20 micrometers, and after the second anisotropically conductive adhesive layer is formed on one of the third dielectric layer and the sixth dielectric layer, the thickness of the second anisotropically conductive adhesive layer is in a range from 15 micrometers to 20 micrometers.

7. A multilayer printed circuit board, comprising:
   a first circuit substrate, the first circuit substrate comprising a first electrically conductive trace layer, a first dielectric layer, and a second dielectric layer, the first electrically conductive trace layer being sandwiched between the first dielectric layer and the second dielectric layer, the first electrically conductive trace layer comprising a first conductive terminal, the second dielectric layer being a solder mask and filling gaps defined between the first electrically conductive trace layer, a first through hole defined in the second dielectric layer with the first conductive terminal exposed therethrough;
   a second circuit substrate, the second circuit substrate comprising a second electrically conductive trace layer, a third dielectric layer, and a fourth dielectric layer, the second electrically conductive trace layer being sandwiched between the third dielectric layer and the fourth dielectric layer, the second electrically conductive trace layer comprising a second conductive terminal, a second through hole defined in the third dielectric layer, a third through hole defined in the fourth dielectric layer, the second conductive terminal being exposed through the second through hole and the third through hole;
   a third circuit substrate, the third circuit substrate comprising a third electrically conductive trace layer, a fifth dielectric layer, and a sixth dielectric layer, the third electrically conductive trace layer being sandwiched between the fifth dielectric layer and the sixth dielectric layer, the third electrically conductive trace layer comprising a third conductive terminal, a fourth through hole defined in the sixth dielectric layer with the third conductive terminal exposed therethrough;
   a first anisotropically conductive adhesive layer adhesively sandwiched between the second dielectric layer and the fourth dielectric layer, and filling the first through hole and the third through hole to electrically connect the first conductive terminal and the second conductive terminal, and a second anisotropically conductive adhesive layer adhesively sandwiched between the third dielectric layer and the sixth dielectric layer, and filling the second through hole and the fourth through hole to electrically connect the second conductive terminal and the third conductive terminal.

8. The multilayer printed circuit board of claim 7, wherein each of the first anisotropically conductive adhesive layer and the second anisotropically conductive adhesive layer comprises a dielectric adhesive body and a plurality of electrically conductive particles dispersed in the dielectric adhesive body.

9. A method for manufacturing multilayer printed circuit board, comprising:
   providing a first circuit substrate, the first circuit substrate comprising a first electrically conductive trace layer, a first dielectric layer, and a second dielectric layer, the first electrically conductive trace layer being sandwiched between the first dielectric layer and the second dielectric layer, the first electrically conductive trace layer comprising a first conductive terminal, the second dielectric layer being a solder mask and filling gaps defined between the first electrically conductive trace layer, a first through hole defined in the second dielectric layer with the first conductive terminal exposed therethrough;
   providing a second circuit substrate, the second circuit substrate comprising a second electrically conductive trace layer, a third dielectric layer, and a fourth dielectric layer, the second electrically conductive trace layer being sandwiched between the third dielectric layer and the fourth dielectric layer, the second electrically conductive trace layer comprising a second conductive terminal and a third conductive terminal, a second through hole defined in the third dielectric layer with the second conductive terminal exposed therethrough, a third through hole defined in the fourth dielectric layer with the third conductive terminal exposed therethrough;

providing a third circuit substrate, the third circuit substrate comprising a third electrically conductive trace layer, a fifth dielectric layer, and a sixth dielectric layer, the third electrically conductive trace layer being sandwiched between the fifth dielectric layer and the sixth dielectric layer, the third electrically conductive trace layer comprising a fourth conductive terminal, a fourth through hole defined in the sixth dielectric layer with the fourth conductive terminal exposed therethrough;

forming a first anisotropically conductive adhesive layer on one of the second dielectric layer and the fourth dielectric layer, and forming a second anisotropically conductive adhesive layer on one of the third dielectric layer and the sixth dielectric layer, and positioning the second circuit substrate between the first circuit substrate and the third circuit substrate, and laminating the first circuit substrate, the second circuit substrate, and the third circuit substrate together, such that the first anisotropically conductive adhesive layer is adhesively sandwiched between the second dielectric layer and the fourth dielectric layer, and extends into the first through hole and the third through hole to electrically connect the first conductive terminal to the third conductive terminal, the second anisotropically conductive adhesive layer is adhesively sandwiched between the third dielectric layer and the sixth dielectric layer, and extends into the second through hole and the fourth through hole to electrically connect the second conductive terminal to the fourth conductive terminal.

10. The method of claim 9, wherein the step of providing the first circuit substrate comprises:
   providing the first dielectric layer, the first dielectric layer comprising a first protective coating and a first adhesive layer formed on the first protective coating, and the first protective coating being a polyimide coating and contacting with a portion of the second dielectric layer filling the gaps defined between the first electrically conductive trace layer;
   providing a first copper foil layer and laminating the first copper foil layer onto the first adhesive layer;
   patterning the first copper foil layer thereby obtaining the first electrically conductive trace layer, and
   forming the second dielectric layer over the first electrically conductive trace layer, and defining the first through hole in the second dielectric layer.

11. The method of claim 10, wherein the second dielectric layer is formed over the first electrically conductive trace layer by printing a solder mask on the first electrically conductive trace layer, and the solder mask is not printed on a portion of the first electrically conductive trace layer for forming the first through hole when the second dielectric layer is printed over the first electrically conductive trace layer, and the first through hole is formed after drying the solder mask.

12. The method of claim 11, wherein the step of providing the second circuit substrate comprises:
   providing the third dielectric layer and defining the second through hole in the third dielectric layer, the third dielectric layer comprising a second protective coating and a second adhesive layer formed on the second protective coating, the second through hole passing through the second protective coating and the second adhesive layer;
   providing a second copper foil layer and laminating the second copper foil layer onto the second adhesive layer;
   patterning the second copper foil layer thereby obtaining the second electrically conductive trace layer, and
   forming the fourth dielectric layer over the third electrically conductive trace layer, the fourth dielectric layer being a solder mask and filling gaps defined between the second electrically conductive trace layer, and defining the third through hole in the fourth dielectric layer.

13. The method of claim 11, wherein the step of providing the third circuit substrate comprises:
   providing the fifth dielectric layer, the fifth dielectric layer comprising a third protective coating and a third adhesive layer formed on the third protective coating;
   providing a third copper foil layer and laminating the third copper foil layer onto the third adhesive layer;
   patterning the third copper foil layer thereby obtaining the third electrically conductive trace layer, and
   forming the sixth dielectric layer over the third electrically conductive trace layer, the sixth dielectric layer being a solder mask and filling gaps defined between the third electrically conductive trace layer, and defining the fourth through hole in the sixth dielectric layer.

14. The multilayer printed circuit board of claim 7, wherein the fourth dielectric layer is a solder mask and filling gaps defined between the second electrically conductive trace layer, and the sixth dielectric layer is a solder mask and filling gaps defined between the third electrically conductive trace layer.

15. The multilayer printed circuit board of claim 14, wherein the first dielectric layer comprises a first protective coating and a first adhesive layer, the first adhesive layer is sandwiched between the first electrically conductive trace layer and the first protective coating, the first protective coating is a polyimide coating and contacting a portion of the second dielectric layer filling the gaps defined between the first electrically conductive trace layer.

* * * * *